US008590688B2

(12) United States Patent
Weigl

(10) Patent No.: US 8,590,688 B2
(45) Date of Patent: Nov. 26, 2013

(54) METHOD AND DEVICE FOR CONVEYING LARGE-AREA, THIN GLASS PLATES

(75) Inventor: Helmut Weigl, Straubing (DE)

(73) Assignee: Grenzebach Maschinenbau GmbH, Asbach-Baeumenheim (DE)

( * ) Notice: Subject to any disclaimer, the term of this patent is extended or adjusted under 35 U.S.C. 154(b) by 202 days.

(21) Appl. No.: 13/061,944

(22) PCT Filed: Aug. 27, 2009

(86) PCT No.: PCT/DE2009/001202
§ 371 (c)(1),
(2), (4) Date: Mar. 2, 2011

(87) PCT Pub. No.: WO2010/025705
PCT Pub. Date: Mar. 11, 2010

(65) Prior Publication Data
US 2011/0170991 A1 Jul. 14, 2011

(30) Foreign Application Priority Data
Sep. 2, 2008 (DE) .......................... 10 2008 045 370

(51) Int. Cl.
*B65G 49/06* (2006.01)
(52) U.S. Cl.
USPC .................................. 198/346.1; 198/465.1
(58) Field of Classification Search
USPC .................................. 198/346.1, 465.1, 345.3
See application file for complete search history.

(56) References Cited

U.S. PATENT DOCUMENTS

| 3,541,597 A | 11/1970 | Segawa et al. |
| 5,109,584 A * | 5/1992 | Irie et al. ........................ 29/33 P |
| 6,435,330 B1 * | 8/2002 | Bonora et al. ............. 198/346.3 |
| 7,845,892 B2 | 12/2010 | Hügler |
| 2001/0008201 A1 * | 7/2001 | Bonora et al. ............. 198/346.1 |
| 2004/0118160 A1 | 6/2004 | Honegger et al. |
| 2007/0045204 A1 | 3/2007 | Huard et al. |
| 2007/0267312 A1 | 11/2007 | Coppola et al. |

FOREIGN PATENT DOCUMENTS

| DE | 1918791 | 10/1969 |
| DE | 10 2004 039 787 A1 | 2/2006 |
| EP | 0 506 198 A1 | 9/1992 |
| EP | 1 323 651 A2 | 7/2003 |
| EP | 1 755 151 A1 | 2/2007 |
| JP | 08-324728 A | 12/1996 |

* cited by examiner

*Primary Examiner* — Mark A Deuble
(74) *Attorney, Agent, or Firm* — Slater & Matsil, L.L.P.

(57) ABSTRACT

Disclosed are a method and a device for conveying large-size thin glass plates in clean-room conditions for the large-scale production of electro-optical products. In one embodiment the device includes a) conveying elements for supplying glass plates; b) processing elements for processing glass plates; c) production lines for combining individual production processes; d) containers that can be loaded with glass plates from two opposite sides; e) carriages for transporting the containers, said carriages having rail wheels while supporting transverse rails for guiding rolls in order to move the containers; f) means for driving the carriages and transversely moving the containers with the help of joint driving motors.

24 Claims, 6 Drawing Sheets

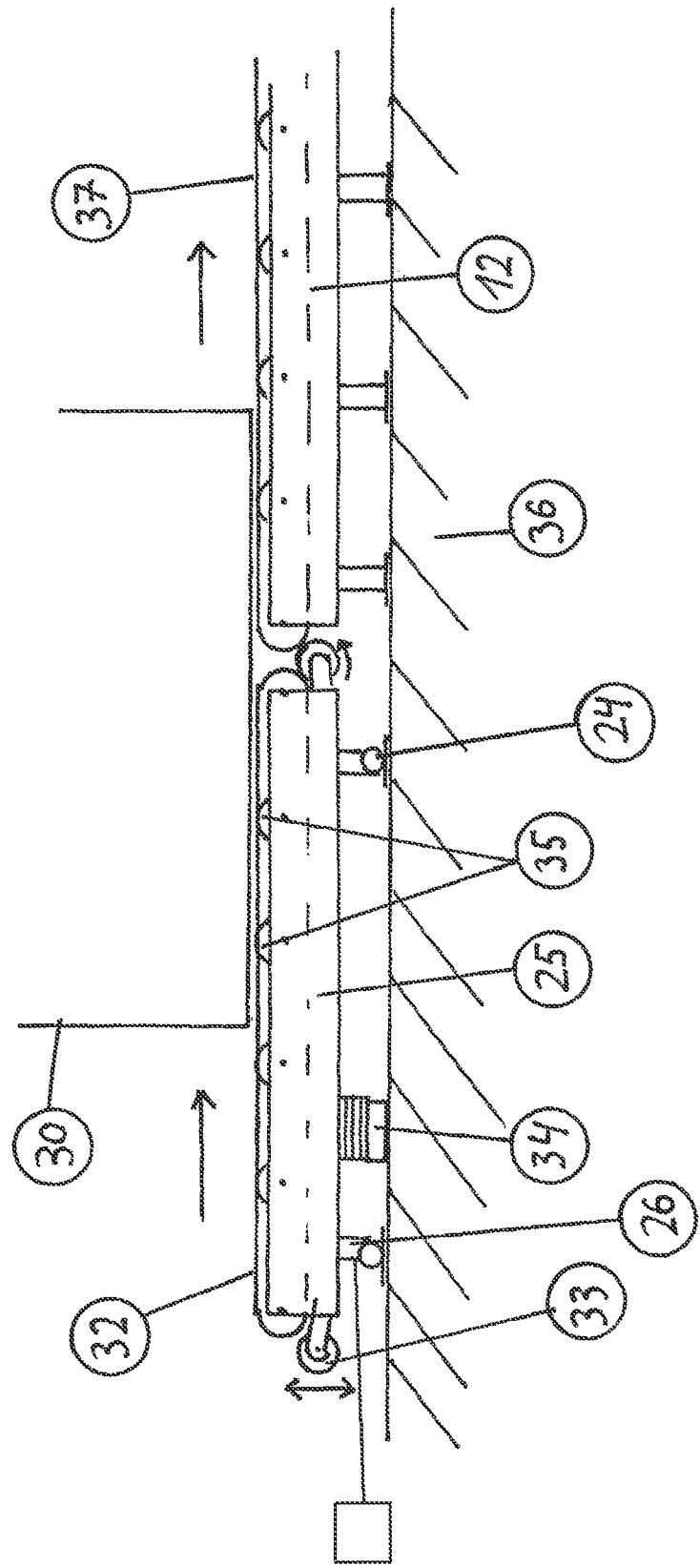

METHOD AND DEVICE FOR CONVEYING LARGE-AREA, THIN GLASS PLATES

This patent application is a national phase filing under section 371 of PCT/DE2009/001202, filed Aug. 27, 2009, which claims the priority of German patent application 10 2008 045 370.6, filed Sep. 2, 2008, which is hereby incorporated herein by reference in its entirety.

TECHNICAL FIELD

The invention relates to the conveyance of large-area, thin glass plates under clean-room conditions for the large-scale production of electrooptical products, in particular, photovoltaic modules or TFT screens.

BACKGROUND

Modern glass façades are often not only a functional element of a building, but are increasingly also being used for solar power generation. Tailor-made solar modules allow closely fit integration into building grids and profiles. Semitransparent solar cells, however, also opaque solar cells with transparent areas, make it possible for photovoltaic glasswork to appear to be infused with sunlight. The solar cells are also increasingly taking over the desired effect of protection against sunlight and glare. The production of such photovoltaic systems requires working conditions of the type that are common in the manufacture of semiconductors and integrated electronic circuits. These so-called clean-room conditions for the manufacture of photovoltaic systems also require the handling of large-area, impact-sensitive glass plates.

Apart from that, large thin glass plates of the type that are used for making large TFT video screens are extremely sensitive to even the smallest impacts due to their structure and simultaneous relatively large mass. An industrial robot is therefore not suitable for manipulating large, thin glass plates in ultraclean rooms owing to a lack of sensitivity and insufficient positioning precision for such cases. The transfer of large impact-sensitive glass plates from the horizontal orientation to a vertical orientation requires particular attentiveness under ultraclean room conditions. Another aspect in the maintenance of ultraclean room conditions, particularly in the production of cost-intensive products, is the danger of contamination by people. An unintended sneeze can destroy an entire production unit. Such a plant likewise requires an increased reliability. Since the costs for the acquisition and operation of a correspondingly equipped industrial robot are high, an economical price for such a handling system is also important.

Precisely in the handling of large-area glass plates by an industrial robot, it is observed that such large surface areas tend to oscillate due to movement. This can be caused firstly by the suction elements adhering to only a few places, and secondly by the accelerated movement sequences of such robots. With these oscillation phenomena, there is an additional risk of glass breakage.

In the device for transferring and stacking plates described in DE 19 18 791 A, the stacking speed of plates is to be considerably increased relative to a stacking operation according to prior art, which is partially manually assisted. This is accomplished largely by performing the lifting or turning of each plate in two steps. In order to be able to handle the respective plate in the method described there, it is fixedly connected by means of a suction unit (4), supplied to various rotatable carrying units and brought into various horizontal and inclined positions until it is finally transferred to a stacking section (11). There are no suggestions for protective and gentle transportation of large-format, thin, shock-sensitive glass plates under ultraclean room conditions.

DE 10 2005 039 453 A1 additionally discloses a modularly constructed processing system for large-area substrates. For protection against contamination, such large-area substrates, for example, TFT video screens, are dependent on enclosures for manipulation under special atmospheric conditions. According to the invention presented in that source, an enclosure of the processing system is forgone, but the modularly-constructed processing facility is furnished with a transfer facility that allows both fast access to the individual modules and a fast conversion between the individual modules, and by means of which a transfer of substrates between the modules is enabled even under clean room conditions. This is achieved by virtue of the fact that the transfer unit has a transfer chamber constructed as an enclosure that houses the substrate support, so that the size of the enclosure can be reduced to the size of the substrate and thus to the absolutely necessary size. This does involve measures for optimizing a processing system under ultraclean room conditions in a certain sense, but the topic of transporting large-format, thin, shock-sensitive glass plates is not dealt with.

In various embodiments of the invention all movable elements comprise an abrasion-protected material and all drive units are emission-protected with respect to abrasion of moving parts.

Embodiments of the invention comprise a computer program with a program code for performing the process steps as described herein when the program is executed in a computer.

Embodiments of the invention include a machine readable medium with a program code for performing the process as described herein when the program is executed in a computer.

SUMMARY OF THE INVENTION

In accordance with one embodiment of the invention a device or a method for the orientation and positioning of large, thin glass plates under clean-room conditions is disclosed. An embodiment of the invention provides a production process or a supply to a given production process without the entry of people, but under human control and monitoring. The corresponding device may be reliable and economical to manufacture. The movement sequences of the glass plates may preclude undesired vibrations.

In accordance with another embodiment of the invention a device or a method for transporting large-format, thin glass plates under clean-room conditions for the purpose of large-scale production of electrooptical products. In one embodiment the electrooptical products are photovoltaic modules or TFT video screens.

BRIEF DESCRIPTION OF THE DRAWINGS

Embodiments of the invention will be described more extensively below. In detail:

FIG. 6 shows a sectional drawing of an additional possibility for transverse displacement.

Figure 1:
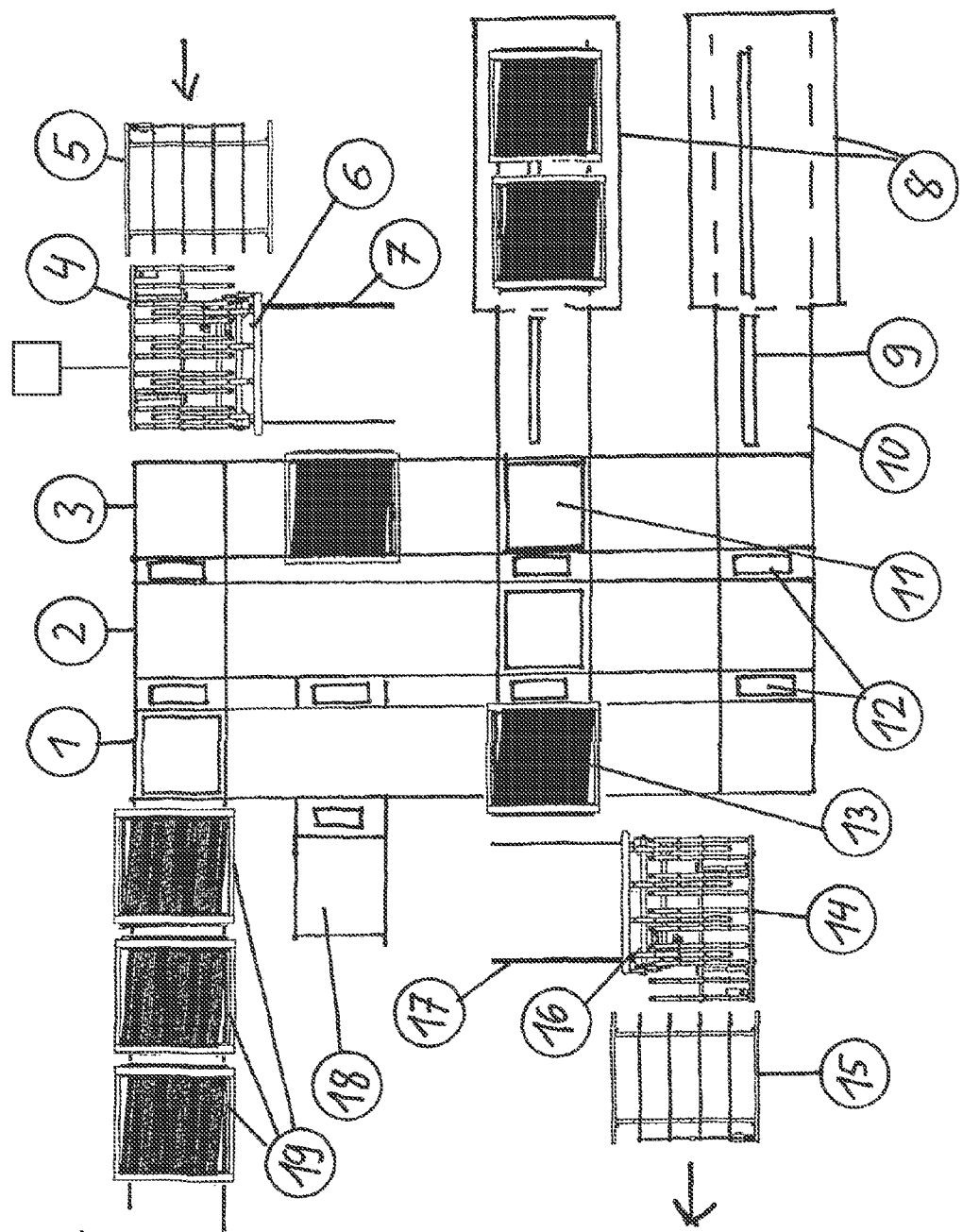
FIG. 1 shows a representation of the manufacturing structure of the production process.

The following list of reference symbols may be used in conjunction with the drawings:
(1) Discharge line
(2) Central transfer line
(3) Loading line
(4) Roller conveyor (input)
(5) Belt conveyor (input)
(6) Device for transfer and loading
(7) Rails of the device for transfer and loading
(8) Autoclave
(9) Drive for transfer to the autoclave—loading
(10) Transverse rails to the autoclave
(11) Carriage for panes—containers
(12) Transfer bridge (transverse transfer from the container)
(13) Container (discharge position)
(14) Roller conveyor for further conveyance
(15) Belt conveyor for further conveyance
(16) Device for transfer and unloading
(17) Rails of the device for transfer and unloading
(18) Containers—removal or disposal of broken glass
(19) Storage space for containers (buffer for congested production)
(20) Transport brackets for manual conveyance
(21) Conveyor—frame
(22) Compartment separation (cross braces)
(23) Rollers on the container for transverse displacement
(24) Rails for carriage
(25) Frame of the carriage
(26) Rail wheels of the carriage
(27) Transverse rail on the carriage
(28) Roller axis of the container
(29) Solar module
(30) Container in a loading position
(31) Storage space for containers (buffer for congested production)
(32) Conveyor belt of the carriage (transverse displacement)
(33) Pressure roller for force transmission
(34) Supply line (chain-like)
(35) Support rollers for the conveyor belt
(36) Factory floor
(37) Conveyor belt for a transfer bridge

DETAILED DESCRIPTION OF ILLUSTRATIVE EMBODIMENTS

For a more complete understanding of embodiments of the present invention, and the advantages thereof, reference is now made to the following descriptions taken in conjunction with the accompanying drawing:

The example of FIG. 1 shows the manufacturing structure of the production process for the conveyance of large-area, thin glass plates under clean-room conditions for the large-scale production of electrooptical products, in particular, photovoltaic modules or TFT screens.

For the sake of example, the loading line (3), the unloading line (1) and a central transfer line (2), on which carriages (11), each bearing containers (13), are loaded, interim-stored or unloaded according to the requirements of the respective production process, are shown here. This is conceived of in essence as the production of photovoltaic modules or TFT video screens. Other comparable products can be produced, however, since the structure of the described device depends on the respective manufacturing process. The containers (13) are particularly suitable for conveying large-format, thin glass plates that are required for the production of photovoltaic modules or TFT video screens. In the upper right corner of FIG. 1, a roller conveyor (4) and a conveyor belt (5) are shown as an example of a possible manner of delivering such a glass plate. A device (6) for transferring and loading that is moved on rails (7) is associated with these modes of delivery.

A roller conveyor (14) and a belt conveyor (15) for further transport of glass plates after they have passed through the respective work step, in this case the treatment in an autoclave (8), that are shown in the lower left corner of FIG. 1 correspond to the displayed modes of delivery. A device (16) for transferring and loading that is moved on rails (17) and corresponds to the device (6) is also associated with the further conveyance.

The transfer bridges (12) constitute the connections between the loading line (3), the unloading line (1) and the center transfer line (2). In the simplest case, they can consist of a roller that allows transverse movement from carriages (11) with the containers (11) [sic; 13] situated thereon. The carriages (11) are driven and the containers (13) are moved transversely according to production conditions via drive means that are not shown here. For the sake of example, only the drive (9) for transfer to the autoclave loader via the rails (10) is shown here.

The storage place (19) is provided as a buffer, so to speak, for a situation in which an unforeseen interruption of the production process occurs and glass plates to be processed accumulate.

The space (18) is provided as an example of the storage of empty containers (13) and/or as the storage place for broken glass.

Figure 2:
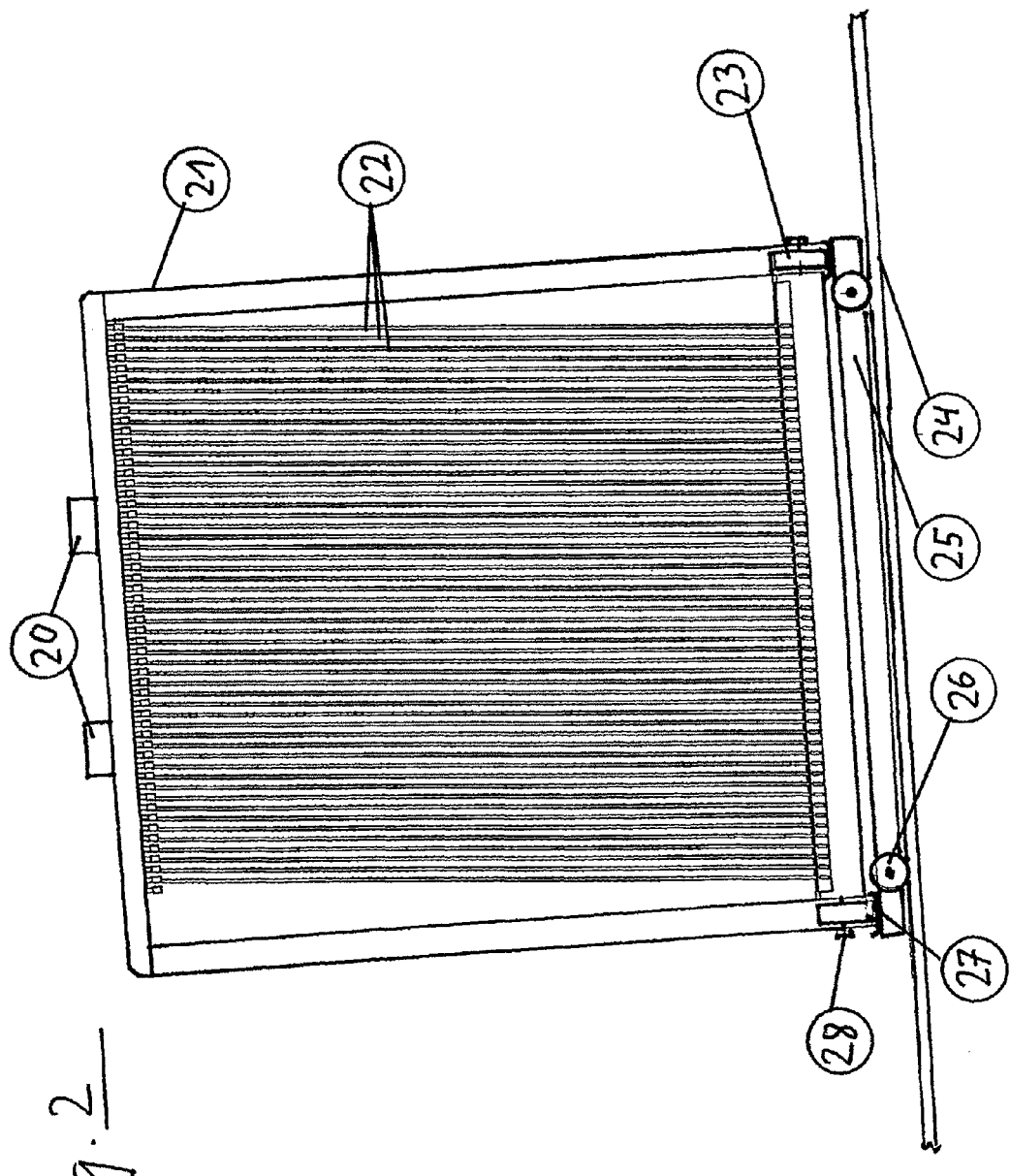
FIG. 2 shows a cross-section of a carriage with a container.

FIG. 2 shows a cross-section of a carriage (11) with a container (13). The carriage (11) is moved according to the production process to be managed on the rails (24) along the loading line (3), the unloading line (1) and/or the central transfer line (2) in the longitudinal direction, as shown in FIG. 1. When such a carriage (11) has reached its destination in the longitudinal direction, the container (13) situated on it is moved transversely and brought to its target position. For this purpose, the frame (25) of the carriage (11) bears track wheels (26) that allow it to move along the respective lines (3, 2, 1). On each carriage (11), there are transverse rails (27) on which the rollers (23) of the respective container (13) loaded thereon can move on the roller axis (28) transversely to the travel direction of the carriage (11).

A container (13), viewed in cross-section, consists in essence of a frame (21) in which a vertical compartment separator (22) is provided. In the simplest case, the latter consists of crossbars fit in transversely along the container (13), the spacings between which result in a relatively narrow compartment. This makes it possible for the glass plates to be positioned corresponding to the width of the compartments at an angle formed by the cross braces. The drives for longitudinally displacing the carriages (11) and transversely displacing the containers (13) can use electric motors in the conventional manner. Such drive possibilities are known to those skilled in the art.

The containers (13) can be loaded from both sides by inserting glass plates by means of appropriate devices (6, 16) for transfer and loading or unloading. In this manner, it is not necessary to turn the respective container (13) for the loading or unloading process. This implies a cost savings in the installation of the production plant by saving the cost of numerous turntables that have been used until now in prior art, and savings of time in production.

For emergency cases, transport brackets (20) are provided on each container (13) for manual conveyance or conveyance by a lifting crane outside the normal controlling of production.

Figure 3:
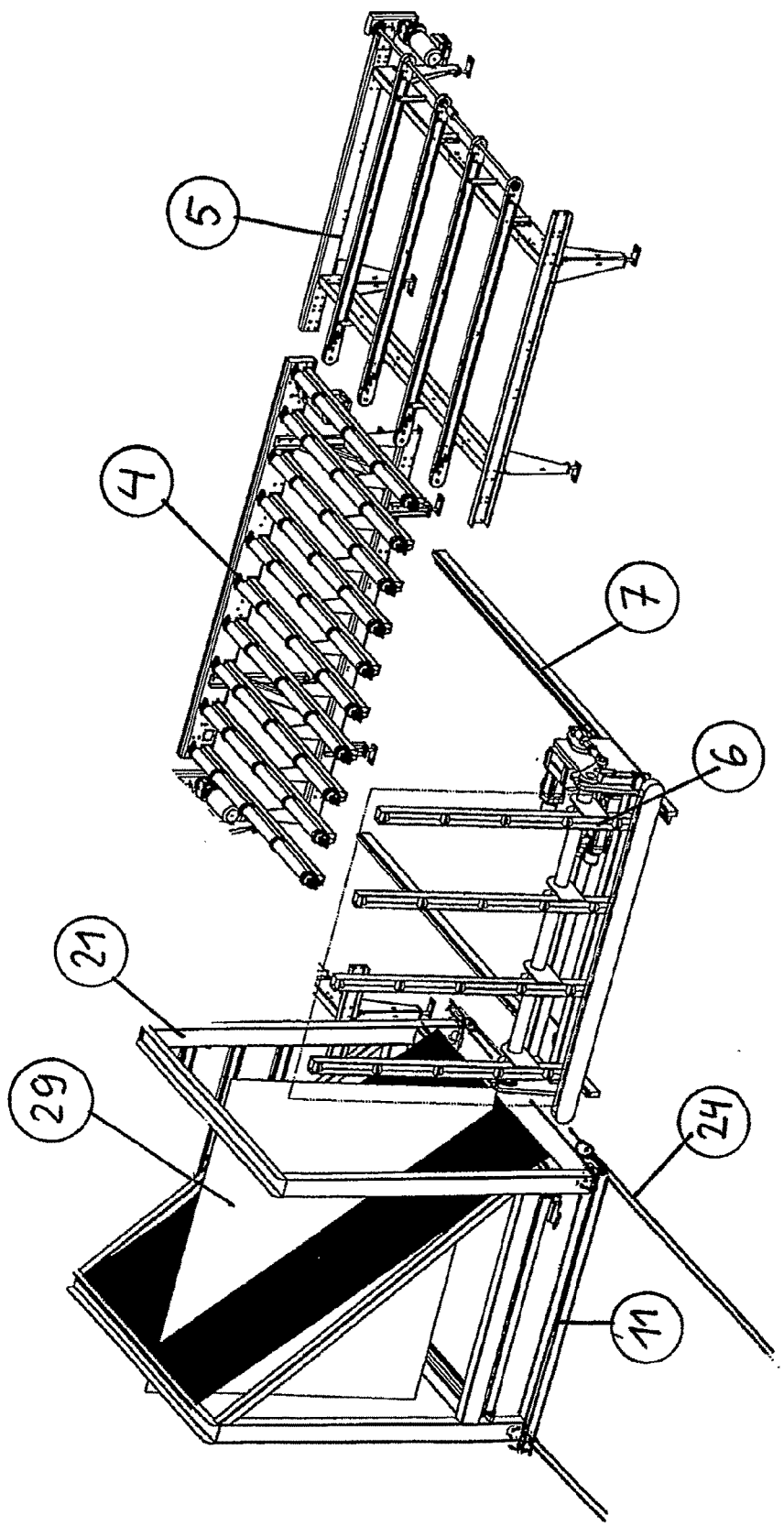
FIG. 3 shows a representation of the loading of a container.

FIG. 3 provides a representation of the loading of a container (13). For the sake of example, a roller conveyor (4) and a belt conveyor (5) are shown here and they supply a glass plate to a transferring and loading device (6) running on rails (7). This device consists essentially of a pivotable surface for holding the glass plate and a device for transferring the plate into a container 13. This is done by means of a process of lifting and translationally conveying the glass plate into the front area of the container (13), lowering it there, and further translational conveyance of the glass plate into the rear area of the container (13). The glass plate can be further conveyed into the rear area of the respective compartment of a container (13) by means of a conveyor belt. In the example of FIG. 3, a solar module (29) is inserted into the front frame (21) of a container (13) on a carriage (11) that runs on rails (24). The dark diagonal surface inside container (13) marks the level of the diagonally inserted compartment separator (22).

Figure 4:
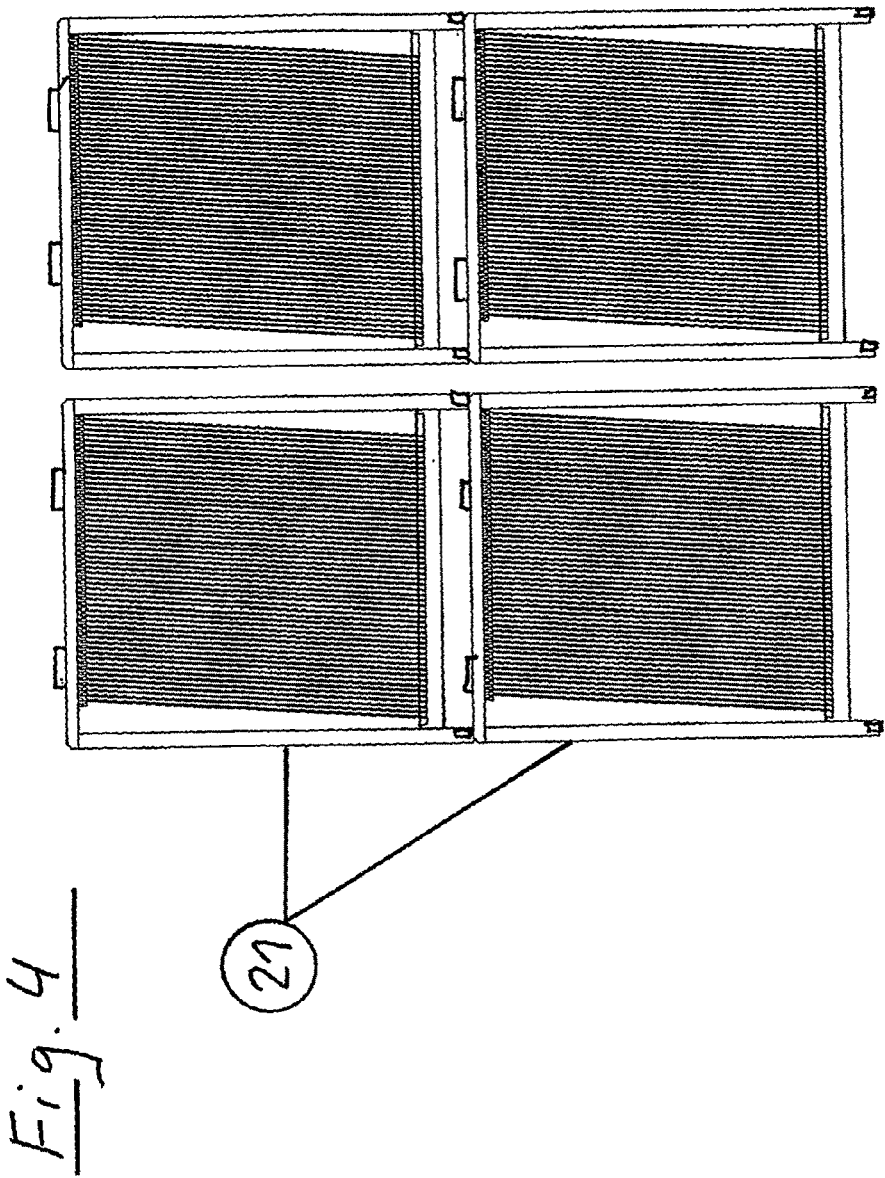
FIG. 4 shows a number of containers at a storage site.

FIG. 4 shows a number of containers (13) at a storage site. The frames (21) of the containers (13) are designed in such a manner that they are stackable on the one hand, and on the other, can resist the load of an arrangement in which they are covered by a number of other frames.

Figure 5:
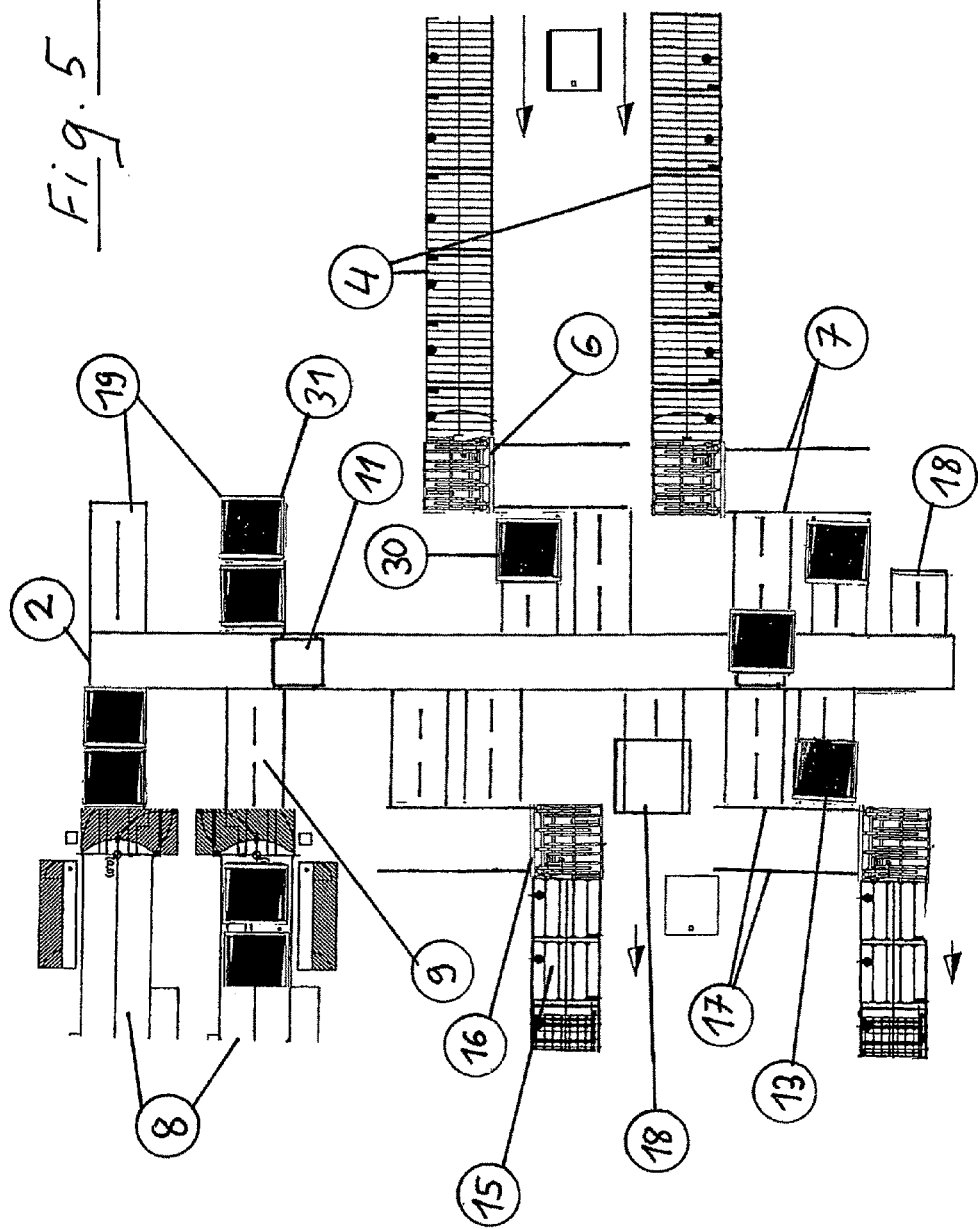
FIG. 5 shows a representation of an additional conveyance possibility.

FIG. 5 provides a representation of another transport possibility with which the problem underlying the invention can be solved in a comparable manner. Instead of the loading line (3), the unloading line (1) and the center transfer line (2) shown in FIG. 1, this configuration uses only a transfer line (2).

In this manner, transfer bridges (12) according to the device in FIG. 1 are saved, but longer distances to the individual processing stations are necessary.

For the sake of example, two parallel roller conveyors (4) are shown at the right side of FIG. 5 as a possible delivery manner for glass plates to be processed, with the respective devices (6) for transfer and loading and the associated rails (7). In the area of the devices (6), two containers (13) labeled with the reference numbers (30) are shown in the loading position.

Here as well, storage places (19) are provided as a buffer, so to speak, for a situation in which an unforeseen interruption of the production process occurs and glass plates to be processed accumulate. A container stored in such a manner is labeled (31).

The space (18) is provided, as in FIG. 1, as an example for the storage of empty containers (13) and/or as the storage place for broken glass.

In the case of FIG. 5 as well, belt conveyors (15) with the associated transfer and unloading device (16) and its rails (17) can be recognized at the left side of the central transfer line (2). A container (13) for further conveyance as well as another space (18) for the storage of empty containers (13) and/or the storage place for broken glass is provided in the area of the lower belt conveyor (15). The drive (9) shown in FIG. 5 for transfer to the two autoclaves (8) in the left upper corner has a different configuration from that in FIG. 1. That has its basis in the fact that, unlike the driving mode of FIG. 1, the transverse movement of the container (13) is driven by the respective carriage (11) itself. In this manner, long transfer paths from the central transfer line (2) shown in FIG. 5 to the respective destination of a container (13) can be achieved.

A closer explanation in this regard is provided by FIG. 6, in which another possibility for transverse displacement is shown, which is advantageously used when only a central transfer line is employed.

In this solution, a container (30) is displaced in the loading position via a conveyor belt (32) that is moved via support rollers (35) in the frame (25) of a carriage (11) transversely to the travel direction. The travel direction of the carriage (11) is defined in FIG. 6 by the rails (24) shown in cross-section and by the rail wheels (26). The motor, not shown in detail, receives its drive energy and control information via the supply line (34) that rolls and unrolls to a greater or lesser extent in the manner of a chain, depending on the position of the carriage (11).

An essential component of the described driving principle is the action of the pressure roller (33) for transferring force onto the transfer bridge (12) shown in FIG. 6. As shown by the double arrow at the left side of FIG. 6, the pressure roller (33) can be moved by means of a separately controllable servomotor, not shown for clarity, into an upper position and a lower position. With the pressure roller (33) at the upper position, this has the effect that the driven conveyor belt (32) is connected in a friction fit to an additional transport belt (37) for a transfer bridge (12). Thus a container (30) can be driven with optional additional controllable pressure rollers (33) solely by the force of a motor situated in the frame (25) of a carriage (11) over additional transfer bridges (12). Additional drives can be saved in this manner. In essence, however, the force transfer to one more or less long transfer bridge (12) will be sufficient.

Since it is necessary for controlling production with the device according to an embodiment of the invention to have exact information on the status of each system part at every point in time, a temporally and spatially exact linkage to a desired transfer bridge (12) is achieved by means of appropriate sensors and data-technical transmission. The production process of the glass plates as shown only relates for the sake of example to the processing in an autoclave. All other processing such as the cutting of glass plates, the interlaying of films between two glass plates, protecting their edges or applying a photovoltaically active film, is performed in the same manner with respect to the transfer from and to the positions of the respective processing. In these cases as well, appropriate sensors supply the respective relevant data to the control center of the entire fabrication plant.

The interactive control of the respectively employed movement elements and sensors requires a special controller program.

While embodiments of this invention have been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:
1. A device for conveying glass plates comprising:
a first conveying element configured to provide the glass plates;
a second conveying element configured to receive the glass plates;
a loading device configured to load the glass plates from the first conveying element into containers, the containers for keeping the glass plates in a substantially vertical direction;

an unloading device configure to unload the glass plates from the containers to the second conveying element, the containers configured to be loaded or unloaded from two opposing sides;

a first processing element configured to process the glass plates;

a transfer unit configured to provide connections among the first processing element, the loading device and the unloading device;

carriages for transporting the containers, the carriages configured to move on the transfer unit, each carriage comprising:

rail wheels for moving the carriage;

transverse rails for guiding rollers for moving the containers; and a common drive motor for driving the carriage and for transversely moving the containers.

2. The device according to claim 1, wherein all movable elements comprise an abrasion-protected material and all drive units are emission-protected with respect to abrasion of moving parts.

3. The device according to claim 1, wherein the carriage further comprises a conveyor belt, wherein the transfer unit comprises a transfer bridge having a transfer conveyor belt and wherein the conveyor belt drives the transfer conveyor belt via a controllable press roller.

4. The device according to claim 1, wherein the device further comprises sensors configured to control the conveying of the glass plates.

5. The device according to claim 1, wherein the transfer unit comprises an unloading line, a transfer line and a loading line.

6. The device according to claim 5, wherein the transfer unit comprises transfer bridges, wherein first transfer bridges are disposed between the unloading line and the transfer line and wherein second transfer bridges are disposed between the transfer line and the loading line.

7. The device according to claim 1, wherein the transfer unit further comprises a storage space for the containers.

8. The device according to claim 1, further comprising a second processing element configured to process the glass plates.

9. A device for conveying glass plates comprising:

a first conveying element configured to provide the glass plates;

a second conveying element configured to receive the glass plates;

a loading device configured to load the glass plates from the first conveying element into containers, the containers for keeping the glass plates in a substantially vertical direction;

an unloading device configure to unload the glass plates from the containers to the second conveying element, the containers configured to be loaded or unloaded from two opposing sides;

a first processing element configured to process the glass plates;

a transfer unit configured to provide connections among the first processing element, the loading device and the unloading device;

carriages for transporting the containers, the carriages configured to move on the transfer unit, each carriages comprising:

rail wheels for moving the carriages;

transverse rails for guiding rollers for moving the containers;

a drive motor for transversely moving the containers; and a common drive motor for driving the carriage over the transfer unit.

10. The device according to claim 9, wherein all movable elements comprise an abrasion-protected material and all drive units are emission-protected with respect to abrasion of moving parts.

11. The device according to claim 9, wherein the carriage further comprises a conveyor belt that is driven by the drive motor.

12. The device according to claim 9, wherein the transfer unit comprises a transfer bridge, the transfer bridge having a transfer conveyor belt and wherein the conveyor belt drives the transfer conveyor belt via a controllable press roller.

13. The device according to claim 9, wherein the device further comprises sensors configured to control the conveying of the glass plates.

14. The device according to claim 9, wherein the transfer unit comprises a transfer line.

15. The device according to claim 9, wherein the transfer unit further comprises a storage space for the containers.

16. The device according to claim 9, further comprising a second processing element configured to process the glass plates.

17. A method for conveying glass plates, the method comprising:

sending the glass plates via a first conveyor belt to a loading device;

loading the glass plates via the loading device into containers;

moving the containers on carriages via a transfer unit to a processing element, the containers for keeping the glass plates in a substantially vertical direction, the containers configured to be loaded or unloaded from two opposing sides, and the carriages comprising rail wheels for moving the carriages and transverse rails for guiding rollers for moving the containers;

processing the glass plates in the processing element;

moving the containers on the carriages via the transfer unit to an unloading device; and unloading the glass plates from the containers via the unloading device onto a second conveyor belt.

18. The method according to claim 17, wherein moving the containers comprises driving the carriages and transversely moving the containers with a common drive motor.

19. The method according to claim 17, wherein moving the containers comprises driving the carriages with a common drive motor and transversely moving the containers with a drive motor.

20. The method according to claim 17, wherein all movable elements comprise an abrasion-protected material and all drives are emission-protected with respect to abrasion of moving parts.

21. The method according to claim 17, wherein moving the containers comprises driving a third conveyor belt with a motor located in the carriage.

22. The method according to claim 21, further comprising driving a transfer conveyor belt of a transfer bridge via a controllable press roller by driving the third conveyor belt.

23. A computer program with a program code for performing the process steps according to claim 17 when the program is executed in a computer.

24. A machine readable medium with a program code for performing the process according to claim 17 when the program is executed in a computer.

* * * * *